(12) United States Patent
Kim et al.

(10) Patent No.: US 7,233,204 B2
(45) Date of Patent: Jun. 19, 2007

(54) METHOD OF ACQUIRING LOW DISTORTION AND HIGH LINEAR CHARACTERISTIC IN TRIODE-TYPED TRANSCONDUCTOR

(75) Inventors: Young Ho Kim, Daejeon (KR); Cheon Soo Kim, Daejeon (KR); Mun Yang Park, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 284 days.

(21) Appl. No.: 10/902,678

(22) Filed: Jul. 28, 2004

(65) Prior Publication Data

US 2005/0052891 A1    Mar. 10, 2005

(30) Foreign Application Priority Data

Sep. 9, 2003    (KR)    ............ 10-2003-0063402

(51) Int. Cl.
*H03F 3/45*    (2006.01)
(52) U.S. Cl. ............... 330/260; 330/253; 330/258
(58) Field of Classification Search ............... None
See application file for complete search history.

(56) References Cited

U.S. PATENT DOCUMENTS

| | | | | |
|---|---|---|---|---|
| 6,549,074 B2 * | 4/2003 | Ugajin et al. | ............... | 330/258 |
| 6,624,698 B2 * | 9/2003 | Nagaraj | ............... | 330/258 |
| 6,724,258 B1 * | 4/2004 | Fayed | ............... | 330/260 |

FOREIGN PATENT DOCUMENTS

| | | |
|---|---|---|
| JP | 2002-237733 | 8/2002 |
| KR | 10-0134908 | 4/1998 |
| KR | 00265336 B1 | 6/2000 |
| KR | 20010029754 A | 4/2001 |

OTHER PUBLICATIONS

M.A.T. Sanduleanu et al., "Large swing, high linearity transconductor in 0.5 um CMOS technology", Electronics Letters, Apr. 30, 1998, vol. 34, No. 9, pp. 878-880.
S. Szczepanski et al., "Differential Pair Transconductor Linearisation Via Electronically Controlled Current-Mode Cells", Electronics Letters, Jun. 4, 1992, vol. 28, No. 12, pp. 1093-1095.
K. Salimi et al., "Continuous-time CMOS circuits based on multi-tanh linearisation principle", Electronics Letters, Jan. 31, 2002, vol. 38, No. 3, pp. 103-104.

* cited by examiner

*Primary Examiner*—Khanh Van Nguyen
(74) *Attorney, Agent, or Firm*—Blakely Sokoloff Taylor & Zafman

(57) ABSTRACT

Provided is a method of acquiring a high linear characteristic and a low distortion in a transconductor (operational transconductance amplifier), especially, in a triode region type transconductor among CMOS transconductors. A resistance is inserted in a source or a drain of an input triode transistor. The transconductor has a simple circuit structure, and has a large linear region, constant transconductance and low total harmonic distortion (THD) characteristic within an error region.

7 Claims, 10 Drawing Sheets

METHOD OF ACQUIRING LOW DISTORTION AND HIGH LINEAR CHARACTERISTIC IN TRIODE-TYPED TRANSCONDUCTOR

This application claims the priority of Korean Patent Application No. 2003-63402, filed on Sep. 9, 2003, in the Korean Intellectual Property Office, the disclosure of which is incorporated herein in its entirety by reference.

BACKGROUND OF THE INVENTION

1. Field of the Invention

The present invention relates to a transconductor, and more particularly, to a method of acquiring a low distortion and high linear characteristic of a triode-typed transconductor and the triode-typed transconductor having low distortion and high linear characteristic.

2. Description of the Related Art

A transconductor (operational transconductance amplifier; OTA) is a circuit that converts an input voltage into a proportional output current, and is used variously in a lot of electric systems such as an active filter, an analog/digital converter, a delta-sigma modulator, an integrator, and/or a gyrator. Generally, the transconductor should have following characteristics. First, the transconductor should have a very large input/output impedance in order to reduce a load effect. Second, the transconductor should have indefinite operational frequency band in order to maintain amplitude and phase of the output current regardless of the input frequency. Third, the voltage-current conversion should be tuned easily in a wide range. Fourth, a common mode rejection ration (CMRR) should be high so that the output DC voltage is adjacent to the input DC voltage. Fifth, the output current should be output in a predetermined proportion to the input voltage within a linear input voltage range. The wide output current swing range in proportion to the input voltage is an important parameter for determining the characteristics of the transconductor. Especially, in order to satisfy desired a signal to noise (S/N) ratio and a distortion ratio in an electric system, the linear input/output ranges should be wide and should be maintained constantly within an error range in the linear range.

There are a lot of linearizing methods of the transconductor, and the transconductor including a complementary metal-oxide semiconductor (CMOS) transistor can be classified into three kinds. That is, a transistor operating in a saturation region, a transistor operation in a triode region, or a transistor combining above two can be used.

FIGS. 1 through 3 are circuit diagrams illustrating various structures of the conventional operational transconductance amplifier (OTA) realized using metal-oxide semiconductor (MOS) transistors. Reference numerals M1, M2, M3, and M4 denote MOS transistors.

The transconductor shown in FIG. 1 has a degenerated differential-pairs structure, in which resistance components (R) that can be tuned are connected to saturation region input transistors M1 and M2 in order to maintain the linearity. However, if the tunable resistance components R are smaller than the impedance $1/G_{m1,2}$ of sources of input transistors M1 and M2, the linearity can be degraded.

The transconductor shown in FIG. 2 is formed in a triode-typed structure, and uses the MOS transistor operating in the triode region, which shows linear current characteristic with respect to the input voltage, as the input transistors M1 and M2. Drain-source voltages of the input transistors M1 and M2 are fixed as small values so that the transistor can be in the triode region, and the transconductance value and tuning region are decided by the value. However, the linearity can be affected by change in the drain-source voltage and mobility (µ).

The transconductor shown in FIG. 3 has a square-law structure, and further includes additional MOS transistors M3 and M4 instead of the resistance components R in the structure of the transconductor in FIG. 1. All of the transistors M1, M2, M3, and M4 operate in the saturated states, the distortion can be reduced and the linearity can be maintained by feedback of harmonic component. There are many other transconductors besides above three structures, however, these are modifications of the above structures.

The transconductor of the degenerated differential-pairs structure in FIG. 1 and the transconductor of square-low structure in FIG. 3 are favorable to obtain high operational speed and high gain, however, few input gates that are connected to each other in parallel should be combined in order to expand the linear input range and reduce the distortion components. The above structure causes complexity in the circuit, consumption of large area, and power consumption, and is not suitable for low voltage circuit since transconductor operates in the saturation region. Moreover, the linear region is narrower than that of transistor operating in the triode region, and the error range of the transconductance is large even in the linear range.

FIG. 4 is a circuit diagram illustrating a part of the triode-typed transconductor that is generally used as the linear transconductor and uses a gain-boosting amplifier feedback.

As described above, the transconductor structure shown in FIG. 2 has higher linear characteristic than those of the transconductor structures shown in FIGS. 1 and 3. As shown in FIG. 4, a node voltage at a drain node (a) in the first MOS transistor M1, that is, the drain-source voltage Vds is maintained constantly by an amplifier 402. Ideally, an output current Io that is in proportion to the input voltage Vin is generated in the triode region T where the input voltage Vin is larger than a sum of a threshold voltage Vth of the first MOS transistor M1 and the node voltage Vds (Vth+Vds). Generally, the transconductance Gm can be represented as following Equation 1.

$$Gm = \mu \cdot C_{ox} \cdot (W/L)_{M1} \cdot V_{ds} \qquad (1),$$

where µ denotes the mobility, $C_{ox}$ denotes a gate metal-oxide capacitance in the first MOS transistor M1, and W/L denotes a ratio between width and length of the first MOS transistor M1.

According to Equation 1, the transconductor having very large linear input/output characteristics can be designed when the node voltage Vds is maintained as a constant in a state of triode region operating mode.

In the triode-typed transconductor structure, the input DC voltage Vin that is input into a gate terminal of the first MOS transistor M1 should increase in order to obtain a large linearity range. However, when the gate input DC voltage Vin is actually increased, the constant transconductance cannot be maintained any more. Because, when the gate voltage increases, the intensity of electric field in a vertical direction toward the channels under the gate insulating layer is strengthened, and accordingly, inversion carriers that are pulled toward the gate insulating layer are bounded toward the channels by an energy wall of the gate insulating layer, that is, scattering between the inversion carriers and the gate insulating layer is generated and drift velocity of the carriers is reduced. Therefore, although the mobility µ in Equation 1 is the constant in an ideal case, the mobility μ is not the constant in actual process. The actual mobility μ can be represented as following Equation 2.

$$\mu = \frac{\mu_0}{1 + (U_a + U_c \cdot V_{bs,eff}) \cdot \left(\frac{V_{gs} + V_{th}}{T_{ox}}\right) + U_b \cdot \left(\frac{V_{gs} + V_{th}}{T_{ox}}\right)^2} \quad (2)$$

As shown in Equation 2, the mobility μ is a function of the gate-source voltage Vgs, and especially, is a variable that is reduced as the gate-source voltage Vgs increases.

Thus, in the actual process, the output current Io does not increase linearly according to the increase of the input voltage Vin, but reduces, as shown in FIG. 6. Like, the transconductance Gm is not maintained constantly, but is reduced. In a case where the input voltage is input in the differential-pairs input method, the linearity may be improved higher than that of single input method. However, the perfect linearity cannot be obtained in the differential-pairs input method, since the non-linearity characteristic is still caused by the variation of the mobility μ due to the gate input voltage Vin.

SUMMARY OF THE INVENTION

The present invention provides a method of acquiring high linearity and low distortion of a triode-typed transconductor, and a triode-typed transconductor therefor having constant and stable transconductance value and low distortion characteristic in a linear range.

According to an aspect of the present invention, there is provided a method of acquiring a high linear characteristics in a transconductor circuit, which uses a metal-oxide semiconductor (MOS) transistor operating in a triode region for obtaining linear characteristics as an input unit, the method including acquiring high linear characteristic using changes in a current slope and transconductance slope caused by changing a drain-source voltage within the triode region without fixing the drain-source voltage.

According to another aspect of the present invention, there is provided a transconductor including: a first transconductor circuit that includes a first MOS transistor operating in a triode region by an input voltage input through a gate electrode, a third MOS transistor that is connected in series to the first MOS transistor, a first current source connected to the third MOS transistor, and a first resistor unit disposed between the first MOS transistor and a grounding; and a second transconductor circuit that includes a second MOS transistor operating in the triode region by an input voltage input through a gate electrode, a fourth MOS transistor connected in series to the second MOS transistor, a second current source connected to the fourth MOS transistor, and a second resistor unit disposed between the second MOS transistor and a grounding.

The transconductor may further include a first cascode circuit that maintains a node voltage between the first MOS transistor and the third MOS transistor constantly; and a second cascode circuit that maintains a node voltage between the second MOS transistor and the fourth MOS transistor constantly.

The first resistor unit may be a passive resistor unit or an active resistor unit, and the active resistor unit may be a MOS transistor.

The second resistor unit may be a passive resistor unit or an active resistor unit, and the active resistor unit may be a MOS transistor.

The gate input voltages in the first MOS transistor and the second MOS transistor may be in a relation of differential pair.

According to a still another aspect of the present invention, there is provided a transconductor including: a first transconductor circuit that includes a first MOS transistor operating in a triode region by an input voltage input through a gate electrode, a first resistor unit connected to the first MOS transistor, a third MOS transistor connected to the first resistor unit, and a first current source connected to the third MOS transistor; and a second transconductor circuit that includes a second MOS transistor operating in the triode region by an input voltage input through a gate electrode, a second resistor unit connected to the MOS transistor, a fourth MOS transistor connected to the second resistor unit, and a second current source connected to the fourth MOS transistor.

The transconductor may further include a first cascode circuit that maintains a node voltage between the first MOS transistor and the third MOS transistor constantly; and a second cascode circuit that maintains a node voltage between the second MOS transistor and the fourth MOS transistor constantly.

The first resistor unit may be a passive resistor unit or an active resistor unit, and the active resistor unit may be a MOS transistor.

The second resistor unit may be a passive resistor unit or an active resistor unit, and the active resistor unit may be a MOS transistor.

The gate input voltages in the first MOS transistor and the second MOS transistor may be in a relation of differential pair.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, preferred embodiments of the present invention will be described in detail with reference to accompanying drawings. However, the embodiments of the present invention can be modified into various shapes, and the scope of the present invention is not limited to the following embodiments.

A triode-typed transconductor of the present invention adopts a structure, in which non-linearity can be compensated by controlling a slope of a transconductance gm in a differential-pairs structure. That is, the triode-typed transconductor includes a resistor unit that makes two transconductances of differential-pairs triode typed transconductor diagonally symmetric to each other, and consequently, makes a sum of two transconductances a constant value. The resistance unit is inserted into a drain or a source of a triode-typed input transistor to change a node voltage Vds, and characteristic curve of each transconductance becomes an oblique line. Hereinafter, the triode-typed transconductor having the above structure according to the present invention will be described through various embodiments.

Figure 1:
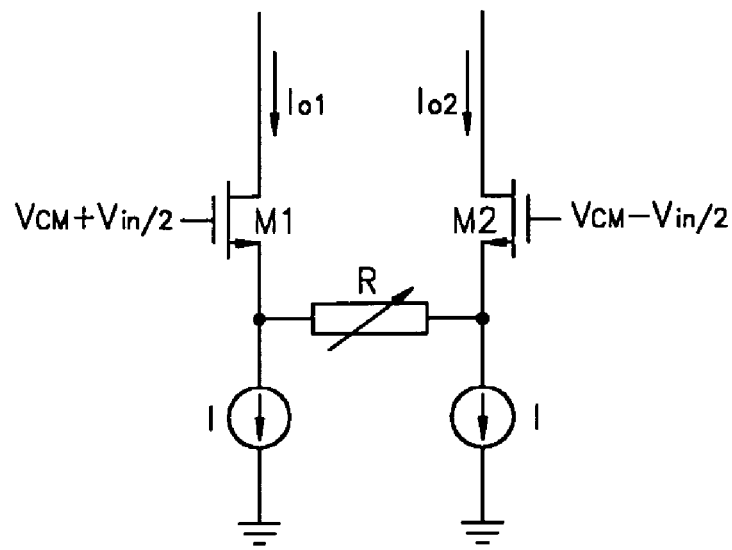
FIG. 1 is a circuit diagram illustrating an example of a linearity structure in a conventional transconductor using metal-oxide semiconductor (MOS) transistors.
Figure 2:
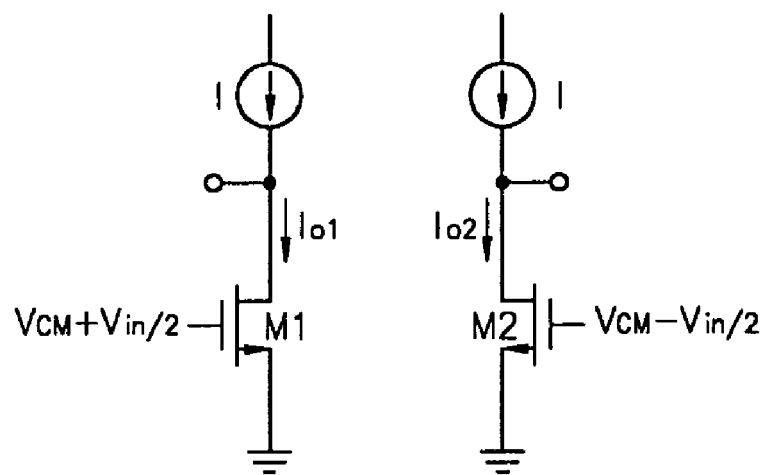
FIG. 2 is a circuit diagram illustrating another example of a linearity structure in the conventional transconductor using MOS transistors.
Figure 3:
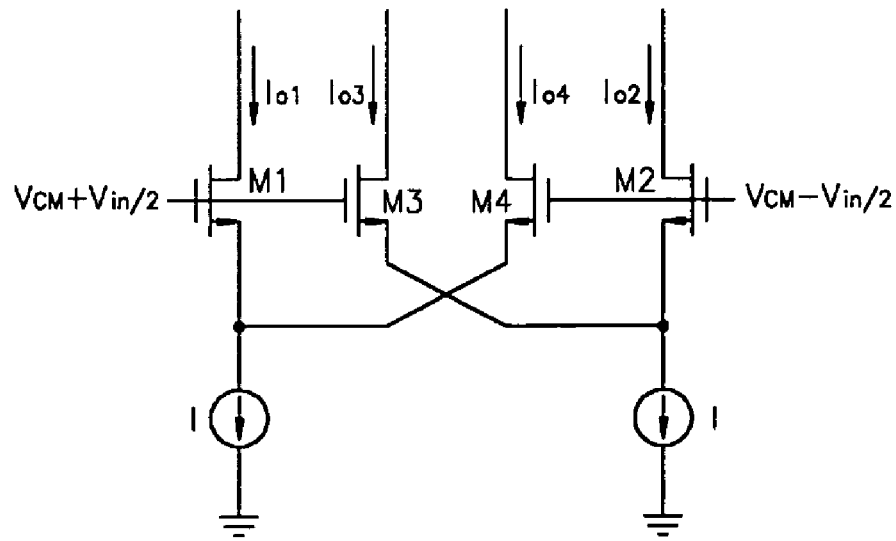
FIG. 3 is a circuit diagram illustrating still another example of a linearity structure in the conventional transconductor using MOS transistor.
Figure 4:
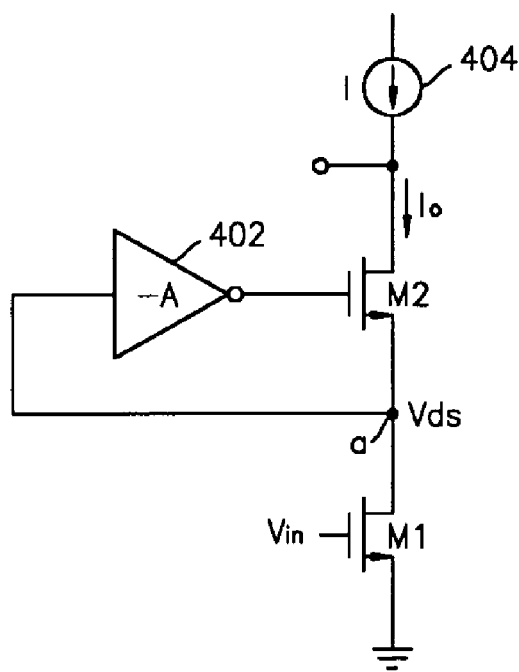
FIG. 4 is a circuit diagram illustrating a part of a triode-typed transconductor using a gain-boosting amplifier feedback that is generally used as a linear amplifier.
Figure 5:
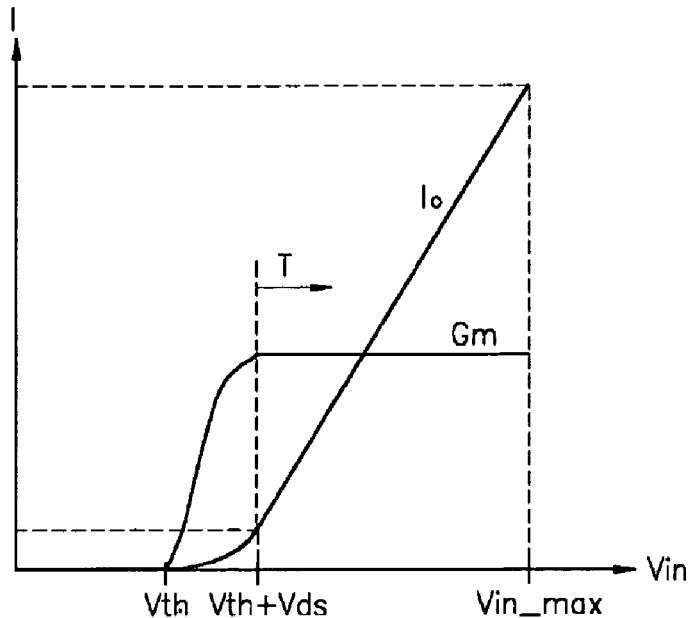
FIG. 5 is a graph illustrating output current and transconductance characteristics with respect to an input voltage in the triode-typed transconductor shown in FIG. 4 in a ideal condition.
Figure 6:
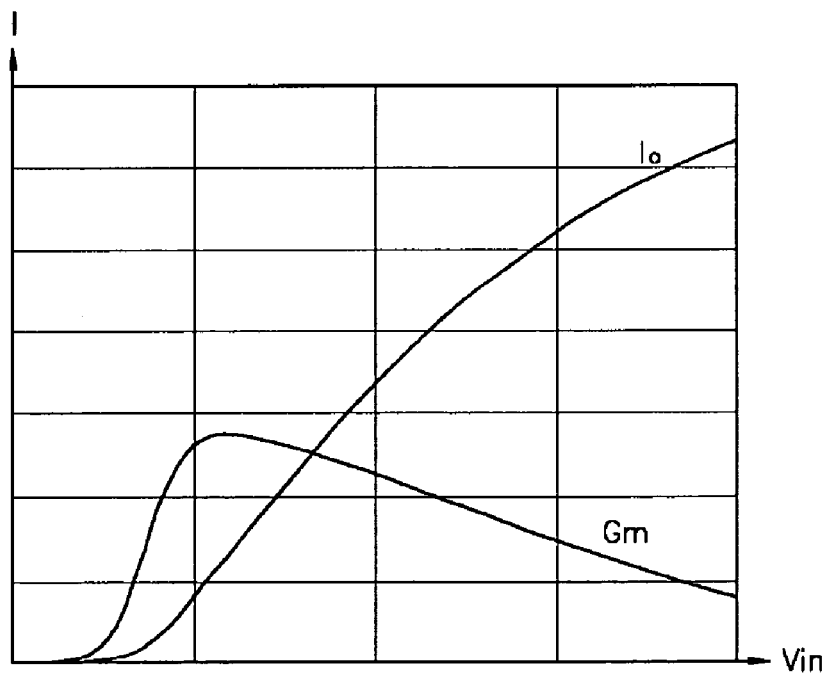
FIG. 6 is a graph illustrating output current and transconductance characteristics with respect to the input voltage in the triode-typed transconductor shown in FIG. 4 in an actual condition.
Figure 7:
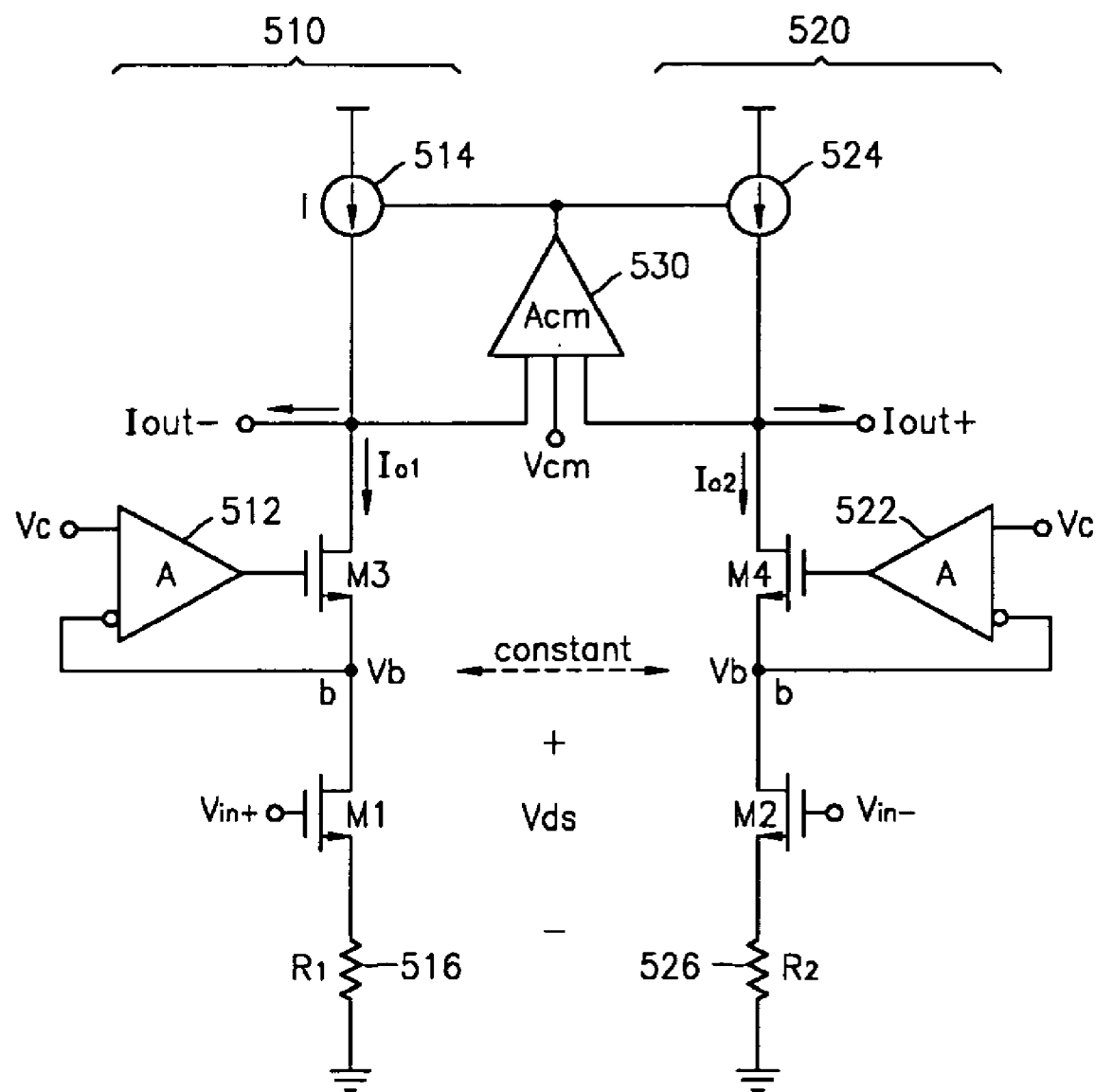
FIG. 7 is a circuit diagram illustrating an embodiment of a triode-typed transconductor according to the present invention.

FIG. 7 is a circuit diagram illustrating a first embodiment of the triode-typed transconductor according to the present invention.

Referring to FIG. 7, the transconductor includes a first transconductor circuit 510 and a second transconductor circuit 520. A common mode amplifier 530 is disposed between the first transconductor circuit 510 and the second transconductor circuit 520 so as to maintain a common mode that makes output DC voltage constant. The common mode amplifier 530 has a common mode gain (Acm), and includes a common mode voltage (Vcm) input terminal for comparing the common mode to differential outputs each other. An output terminal Iout− of the first transconductor circuit 510 that is connected to the common mode amplifier 530 maintains the common mode by the common mode amplifier 530. Also, an output terminal Iout+ of the second transconductor circuit 520 that is connected to the common mode amplifier 530 maintains the common mode.

The first transconductor circuit 510 includes a first metal-oxide semiconductor (MOS) transistor M1, a third MOS transistor M3, a first amplifier 512 that constructs a regulator cascode circuit, a first output current source 514 including a PMOS, and a first resistor 516. A differential-pair input voltage Vin+ is input to a gate terminal of the first MOS transistor M1 that operates in the triode region. A source terminal of the first MOS transistor M1 is connected to a terminal of the first resistor 516 that has a resistance R1. The other terminal of the first resistor 516 is grounded. A drain terminal of the first MOS transistor M1 is connected to a node b. A source terminal of the third MOS transistor M3 is also connected to the node b. A reference voltage Vc is input into one of two input terminals of the first amplifier 512, and another input terminal of the first amplifier 512 is connected to the node b. The first amplifier 512 maintains the node voltage Vx at the node b constantly with respect to the reference voltage Vc. The drain terminal of the third MOS transistor is connected to the first current source 514.

The second transconductor circuit 520 includes a second MOS transistor M2, a fourth MOS transistor M4, a second amplifier 522 that constructs the regulator cascode circuit, a second output current source 524 including a PMOS, and a second resistor 526. The differential pair input voltage Vin− is input to a gate terminal of the second MOS transistor M2. A source terminal of the second MOS transistor M2 is connected to one terminal of the second resistor 526 that has a resistance R2. Another terminal of the second resistor 526 is grounded. A drain terminal of the second MOS transistor M2 is connected to the node b. A source terminal of the fourth MOS transistor M4 is also connected to the node b. A gate terminal of the fourth MOS transistor M4 is connected to an output terminal of the second resistor 522. The reference voltage Vc is input into one of two input terminals of the second amplifier 522, and another input terminal of the second amplifier 522 is connected to the node b. Here, the second amplifier 522 makes the node voltage Vx at the node b maintain constantly with respect to the reference voltage Vc. The drain terminal of the fourth MOS transistor M4 is connected to the second current source 524.

In the transconductor having the above structure, the first resistor 516 having the first resistance R1 can control the drain-source voltage Vds as dependent on the variation of the input voltage Vin+ and output current Io1, and accordingly, changes a tilt of the first transconductance gm1 of the first transconductor circuit 510. In addition, the second resistor 526 having the second resistance R2 can control the drain-source voltage Vds as dependent on the variation of the input voltage Vin− and the output current Io2, and accordingly, changes a tilt of the second transconductance gm2 of the second transconductor circuit 520. Since the first transconductor circuit 510 and the second transconductor circuit 520 are differential pair, when the first transconductance gm1 and the second transconductance gm2 become symmetric with each other, the total transconductance gmT can be maintained constantly.

Figure 8:
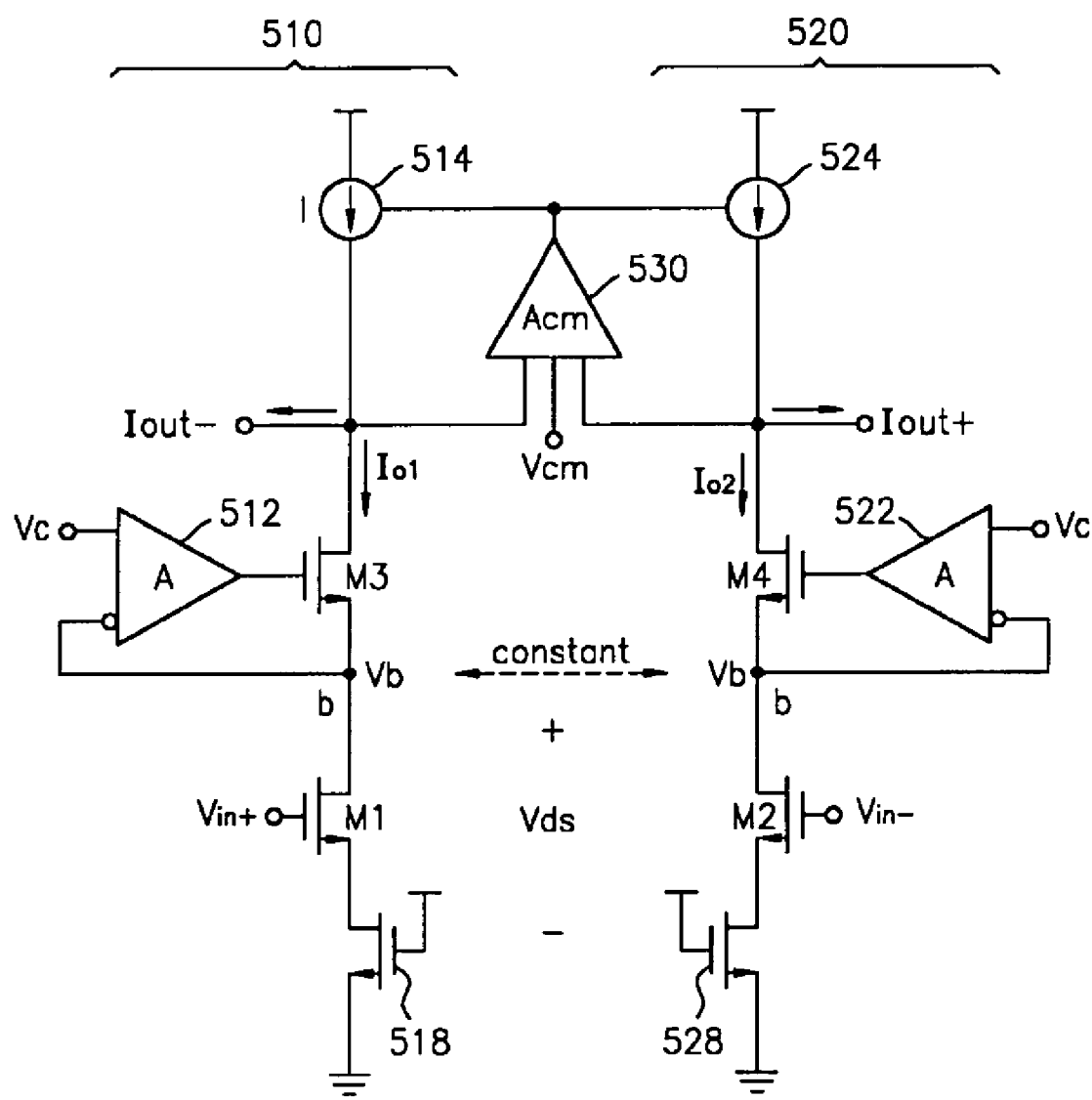
FIG. 8 is a circuit diagram illustrating another embodiment of the triode-typed transconductor according to the present invention.

FIG. 8 is a circuit diagram illustrating a second embodiment of the triode-typed transconductor according to the present invention. In FIG. 8, same reference numerals as those of FIG. 7 denote same elements. Thus, descriptions for the same elements as those of FIG. 7 will be omitted.

As shown in FIG. 8, the transconductor of the present embodiment is different in that an active resistance device realized by the MOS is used unlike the first embodiment, in which the passive resistor is used. That is, a first active resistance device 518 is disposed between the source terminal and the grounded terminal of the first MOS transistor M1 in the first transconductor circuit 510. Also, a second active resistance device 528 is disposed between the source terminal and the grounded terminal of the second MOS transistor M2 in the second transconductor circuit 520. The first active resistance device 518 and the second active resistance device 528 are fabricated using MOS transistors. A drain terminal of the first active resistance device 518 is connected to the source terminal of the first MOS transistor M1, and a source terminal of the first active resistance device 518 is grounded. A drain terminal of the second active resistance device 528 is connected to the source terminal of the second MOS transistor M2, and a source terminal of the second active resistance device 528 is grounded. Performances of the first active resistance device 518 and the second active resistance device 528 are same as those of the first resistor 516 and the second resistor 526 shown in FIG. 7.

Figure 9:
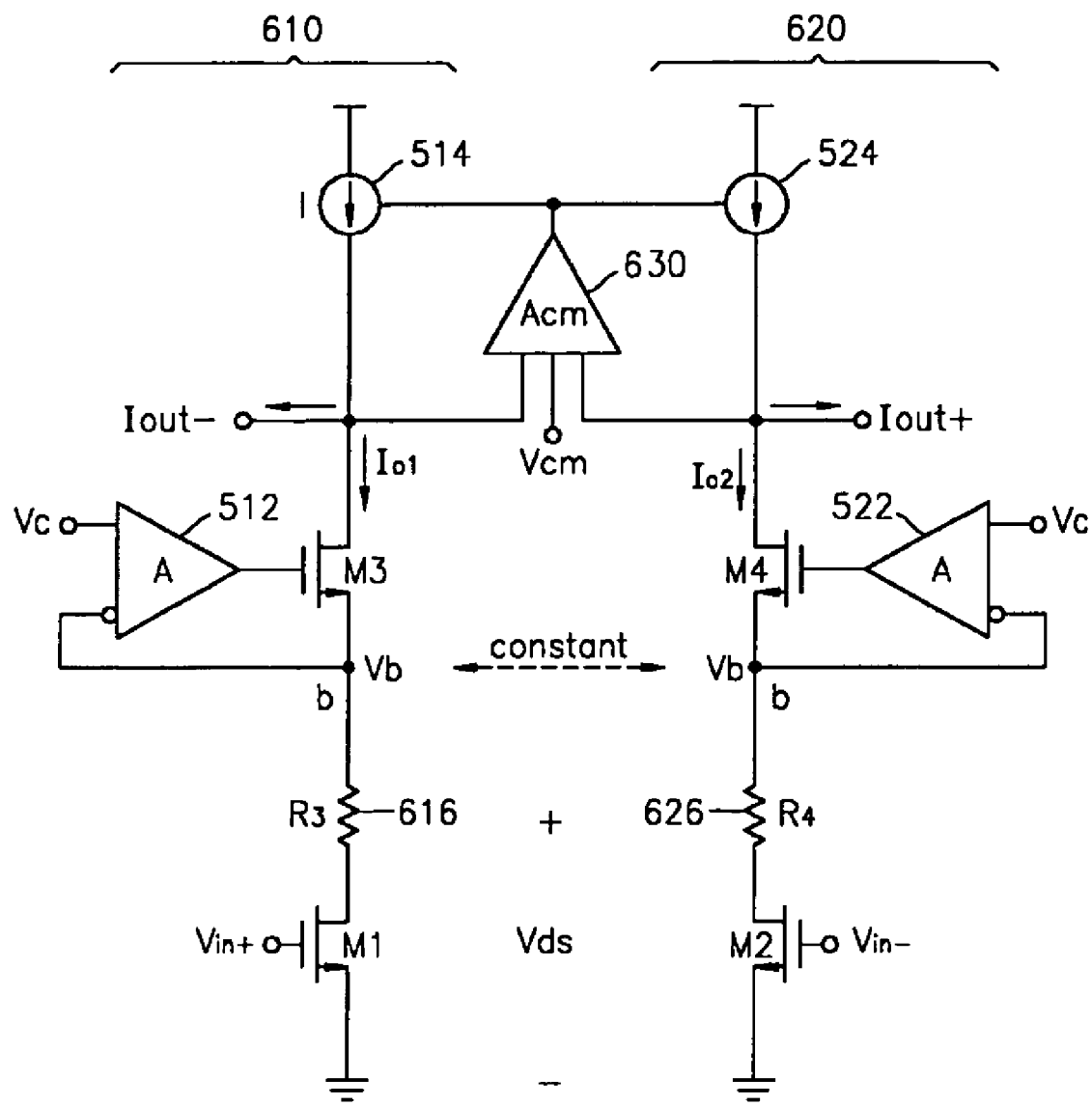
FIG. 9 is a circuit diagram illustrating a still another embodiment of the triode-typed transconductor according to the present invention.

FIG. 9 is a circuit diagram illustrating a third embodiment of the triode-typed transconductor according to the present invention.

Referring to FIG. 9, the transconductor of the third embodiment includes a first transconductor circuit 610 and a second transconductor circuit 620. A common mode amplifier 630 is disposed between the first transconductor circuit 610 and the second transconductor circuit 620. The common mode amplifier 630 has a common mode gain Acm, and includes a common mode voltage Vcm input terminal. An output terminal Iout− of the first transconductor circuit 610, which is connected to the common mode amplifier 630, maintains the common mode by the common mode amplifier 630. Also, an output terminal Iout+ of the second transconductor 620, which is connected to the common mode amplifier 630, maintains the common mode.

The first transconductor circuit 610 includes the first MOS transistor M1, the third MOS transistor M3, a first amplifier 612 that constructs a regulator cascode circuit, a first output current source 614 including PMOS, and a first resistor 616. The differential input voltage Vin+ is input through the gate terminal of the first MOS transistor that operates in the triode region. The source terminal of the first MOS transistor is grounded. The drain terminal of the first MOS transistor M1 is connected to one terminal of the first resistor 616 having the first resistance R1. Another terminal of the first resistor 616 is connected to the node b. The source terminal of the third MOS transistor M3 is also connected to the node b. The gate terminal of the third MOS transistor M3 is connected to an output terminal of the first amplifier 612. The reference voltage Vc is input into one of two terminals of the first resistor 612, and another terminal of the first resistor 612 is connected to the node b. Here, the first amplifier 612 compares the node voltage Vx at the node b to the reference voltage Vc to maintain the node voltage Vx constantly. The drain terminal of the third MOS transistor M3 is connected to the first current source 614.

The second transconductor circuit 620 includes the second MOS transistor M2, the fourth MOS transistor M4, a second amplifier 622 that constructs the regulator cascode circuit, a second output current source 624 including the PMOS, and a second resistor 626. The differential pair input voltage Vin− is input through the gate terminal of the second MOS transistor M2 that operates in the triode region. The source terminal of the second MOS transistor M2 is grounded. The drain terminal of the second MOS transistor M2 is connected to one terminal of the second resistor 626 having the resistance R2. Another terminal of the second resistor 626 is connected to the node b. The source terminal of the fourth MOS transistor M4 is also connected to the node b. The gate terminal of the fourth MOS transistor M4 is connected to an output terminal of the second amplifier 622. The reference voltage Vc is input into one of two input terminals of the second amplifier 622, and another terminal of the second amplifier 622 is connected to the node b. The second amplifier 622 compares the node voltage Vx at the node b to the reference voltage Vc to maintain the node voltage Vx constantly. The drain terminal of the fourth MOS transistor M4 is connected to the second output current source 624.

In the transconductor having the above structure, the first resistor 616 having the first resistance R1 can control the drain-source voltage Vds as dependent on the variations of the input voltage Vin+ and the output current Io1, and accordingly, the first transconductance gm1 of the first transconductor circuit 610 linearly increases or decreases. In addition, the second resistor 626 having the second resistance R2 can control the drain-source voltage Vds as dependent on the variations of input voltage Vin− and the output current Io2, and accordingly, the second transconductance gm2 of the second transconductor circuit 620 linearly increases or decreases. Since the first transconductor circuit 610 and the second transconductor circuit 620 are the differential pair, when the first transconductance gm1 increases, the second transconductance gm2 is reduced, and when the first transconductance gm1 is reduced, the second transconductance gm2 increases. When the increasing rate (or reducing rate) of the first transconductance gm1 is symmetric with the reducing rate (or increasing rate) of the second transconductance gm2, the total transconductance gmT can be maintained constantly. Especially, the total transconductance gmT can be maintained constantly even if the drain-source voltage Vds of the first MOS transistor M1 and the second MOS transistor M2 change.

In the transconductor shown in FIG. 7, the gate-source voltage Vgs, as well as the drain-source voltage Vds, is changed according to the input voltage Vin+ or Vin−, however, according to the transconductor of the present embodiment, the drain-source voltage Vds is changed according to the input voltage Vin+ or Vin−, but the gate-source voltage Vgs is not changed. Thus, the transconductor of the present embodiment consumes less electric current. However, since the changed amount of the gate-source voltage Vgs is very small in the transconductor of FIG. 7, the transconductor of FIG. 7 has nearly same effect as that of the transconductor of the present embodiment.

Figure 10:
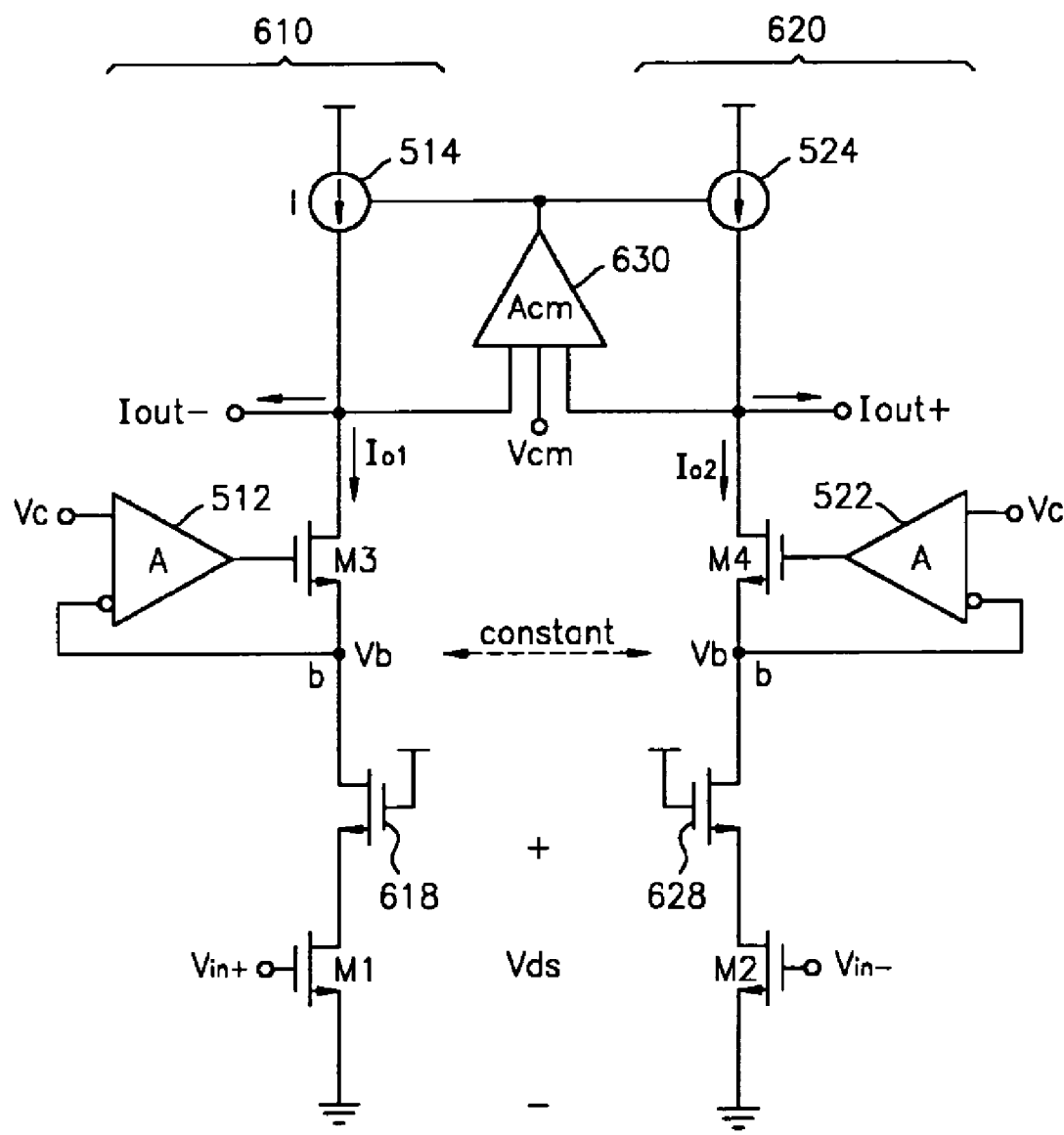
FIG. 10 is a circuit diagram illustrating yet still another embodiment of the triode-typed transconductor according to the present invention.

FIG. 10 is a circuit diagram illustrating a fourth embodiment of the triode-typed transconductor according to the present invention. In FIG. 10, same reference numerals as those of FIG. 9 denote same elements, thus descriptions for the same elements as those of FIG. 9 will be omitted.

As shown in FIG. 10, the transconductor uses an active resistance device realized by the MOS, while the transconductor of the third embodiment uses the passive resistor. That is, a first active resistance device 618 is disposed between the drain terminal and the node b of the first MOS transistor in the first transconductor circuit 610. A second active resistance device 628 is also disposed between the drain terminal and the node b of the second MOS transistor M2 in the second transconductor circuit 620. The first active resistance device 618 and the second active resistance device 628 are fabricated using MOS transistors. The drain terminal of the first active resistance device 618 is connected to the node b, and the source terminal is connected to the drain terminal of the first MOS transistor M1. The drain electrode of the second active resistance device 628 is connected to the node b, and the source terminal is connected to the second MOS transistor M2. performances of the first active resistance device 618 and the second active resistance device 628 are same as those of the first resistor 616 and the second resistor 626 shown in FIG. 9.

Figure 11:
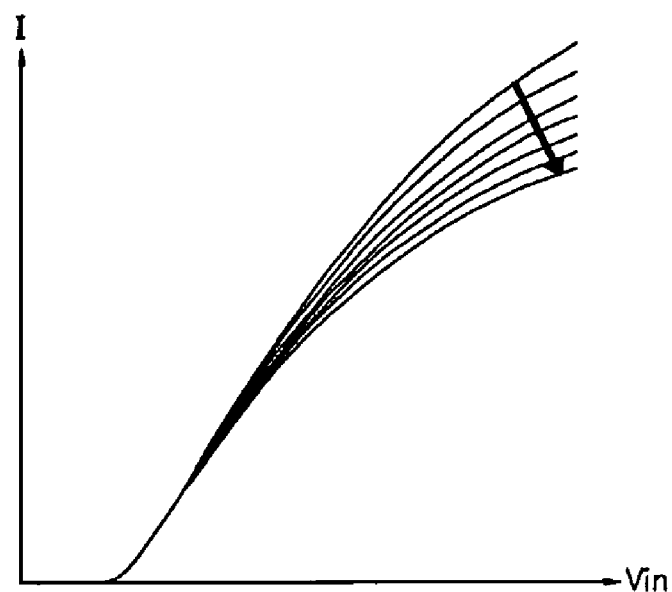
FIG. 11 is a graph showing variation of output current according to resistance sizes of the triode-typed transconductor according to the present invention.
Figure 12:
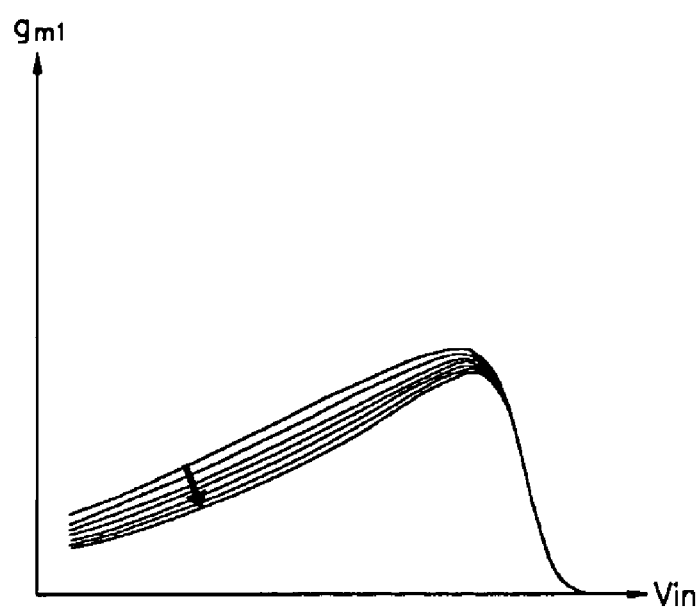
FIG. 12 is a graph showing variation of a first transconductance according to the resistance sizes in the triode-typed transconductor according to the present invention.
Figure 13:
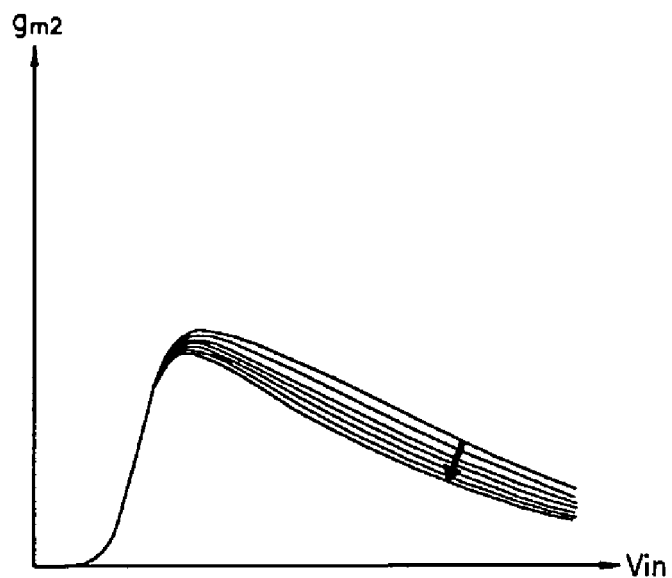
FIG. 13 is a graph showing variation of a second tranconductance according to the resistance sizes in the triode-typed transconductor according to the present invention.
Figure 14:
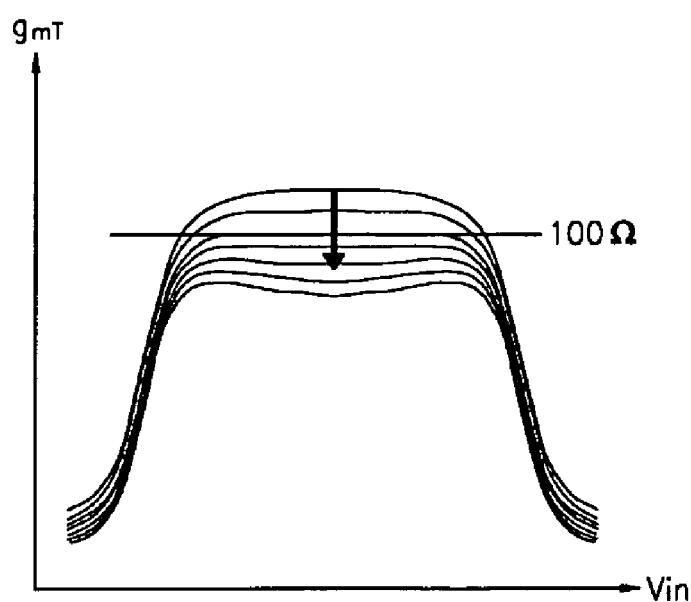
FIG. 14 is a graph showing variations of entire transconductances according to the resistance sizes in the triode-typed transconductor according to the present invention.

FIGS. 11 through 14 are graphs describing characteristics variation according to the resistance size of the triode-typed transconductor. In detail, FIG. 11 is a graph showing output current changes according to the resistance size, FIG. 12 is a graph showing changes in the first transconductance according to the resistance size, FIG. 13 is a graph showing changes in the second transconductance according to the resistance size, and FIG. 14 is a graph showing changes in the total transconductance according to the resistance size. The resistance size is changed in a range of 0–300Ω, and arrows denote the increase of resistance.

As shown in FIG. 11, when the size of the input voltage Vin increases, the output current also increases, however, the increased degree can be varied from the sizes of the first resistance R1 and the second resistance R2. That is, as the sizes of the first resistance R1 and the second resistance R2 become larger, the attenuation degree of the output currents Io1 and Io2 increase. Thus, it is desirable that the first resistance R1 and the second resistance R2 are not large in a point of the output current. Next, as shown in FIG. 12, when the input voltage Vin increases, the size of the first transconductance gm1 also increases, and the increased degree becomes larger when the first resistance R1 and the second resistance R2 are large. As shown in FIG. 13, the size of the second transconductance gm2 is reduced when the input voltage Vin increases, and the reduced degree becomes larger when the first resistance R1 and the second resistance R2 are large. Since the total transconductance gmT is the sum of the first transconductance gm1 in FIG. 12 and the second transconductance gm2 in FIG. 13, the total transconductance forms a roughly horizontal curve within a certain range of input voltage Vin. The flatness of the curve can vary from the sizes of the first resistance R1 and second resistance R2. That is, when the first resistance R1 and the second resistance R2 are small, the total transconductance curve becomes convex to some degree, and when the first resistance R1 and the second resistance R2 are large, the curve becomes concave to some degree. The first resistance R1 and the second resistance R2 that make the total transconductance gmT curve flattest are about 100Ω. Thus, the optimal resistance value that makes the total transconductance value constant can be recognized.

Figure 15:
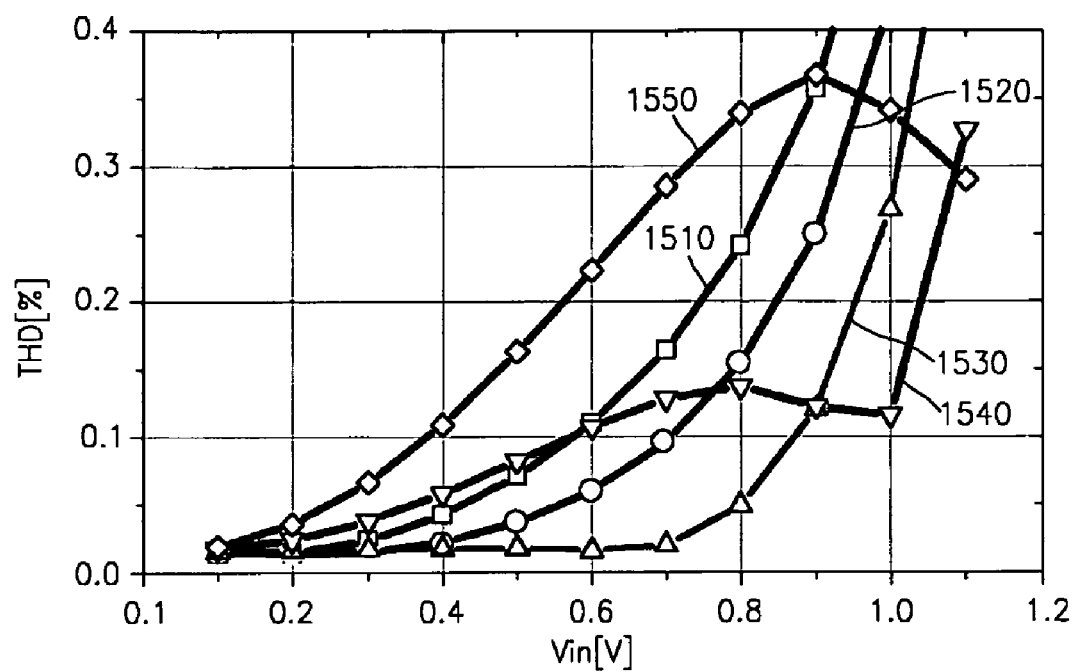
FIG. 15 is a graph showing total harmony distortion (THD) characteristics according to the resistance sizes of the triode-typed transconductor according to the present invention.

FIG. 15 is a graph showing a total harmonic distortion (THD) characteristics according to the resistance size of the triode-typed transconductor according to the present invention.

As shown in FIG. 15, in a predetermined input voltage Vin region, for example, the input voltage region of 0.7V or less, 1510 denotes the conventional curve when the first resistance R1 and the second resistance R2 are 0Ω. In a case where the first resistance R1 and the second resistance R2 are 200Ω, the curve (represented as 1540) shows similar THD characteristic to that of the conventional art. In a case where the first resistance R1 and the second resistance R2 are 50Ω and in a case where the resistance values are 100Ω, the curves (represented as 1520 and 1530) show lower THD characteristics than that of the conventional curve, that is, good THD characteristics. However, in a case where the first resistance R1 and the second resistance R2 are 300Ω, the curve (represented as 1550) shows higher THD characteristic than that of the conventional curve. Thus, the best THD characteristic can be obtained when the first resistance R1 and the second resistance R2 are about 100Ω.

According to the transconductor having improved linear characteristic of the present invention, the signal distortion can be reduced by maintaining the transconductance constantly in the linear range, and accordingly, the standards required by various electric systems can be satisfied.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A transconductor comprising:
   a first transconductor circuit that includes a first MOS transistor operating in a triode region by an input voltage input through a gate electrode, a first resistor unit connected to the first MOS transistor, a third MOS transistor connected to the first resistor unit, and a first current source connected to the third MOS transistor; and
   a second transconductor circuit that includes a second MOS transistor operating in the triode region by an input voltage input through a gate electrode, a second resistor unit connected to the second MOS transistor, a fourth MOS transistor connected to the second resistor unit, and a second current source connected to the fourth MOS transistor, wherein
   a resistance value of the first resistor unit and the second resistor unit are chosen such that a sum of transconductances of the first transconductor circuit and the second transconductor circuit is substantially constant for a range of input voltage values.

2. The transconductor of claim 1, further comprising:
   a first cascode circuit that maintains a node voltage between the first MOS transistor and the third MOS transistor constantly; and
   a second cascode circuit that maintains a node voltage between the second MOS transistor and the fourth MOS transistor constantly.

3. The transconductor of claim 1, wherein the first resistor unit is a passive resistor unit or an active resistor unit.

4. The transconductor of claim 3, wherein the active resistor unit is a MOS transistor.

5. The transconductor of claim 1, wherein the second resistor unit is a passive resistor unit or an active resistor unit.

6. The transconductor of claim 5, wherein the active resistor unit is a MOS transistor.

7. The transconductor of claim 1, wherein the gate input voltages in the first MOS transistor and the second MOS transistor are in a relation of differential pair.

* * * * *